US012615023B2

(12) United States Patent
van der Cammen et al.

(10) Patent No.: US 12,615,023 B2
(45) Date of Patent: Apr. 28, 2026

(54) FOUR-PHASE GENERATION CIRCUIT WITH FEEDBACK

(71) Applicant: NXP B.V., Eindhoven (NL)

(72) Inventors: Peter van der Cammen, Delft (NL); Marcel Wenting, Nijmegen (NL); Maarten Lont, Eindhoven (NL)

(73) Assignee: NXP B.V., Eindhoven (NL)

( * ) Notice: Subject to any disclaimer, the term of this patent is extended or adjusted under 35 U.S.C. 154(b) by 509 days.

(21) Appl. No.: 18/194,141

(22) Filed: Mar. 31, 2023

(65) Prior Publication Data

US 2023/0318552 A1 Oct. 5, 2023

(30) Foreign Application Priority Data

Apr. 4, 2022 (EP) .................................... 22166534

(51) Int. Cl.
H03F 3/45 (2006.01)

(52) U.S. Cl.
CPC ..... H03F 3/45475 (2013.01); H03F 3/45932 (2013.01); H03F 3/45183 (2013.01); H03F 3/45659 (2013.01); H03F 2203/45082 (2013.01)

(58) Field of Classification Search
CPC ............. H03F 3/45475; H03F 3/45932; H03F 2203/45082; H03F 3/45659; H03F 3/45183; H03B 27/00; H03K 5/1565
USPC ........................................................ 330/258
See application file for complete search history.

(56) References Cited

U.S. PATENT DOCUMENTS

| | | | |
|---|---|---|---|
| 6,768,364 B2 | 7/2004 | Wang | |
| 7,831,234 B2 * | 11/2010 | Schelmbauer | H03D 7/1466 |
| | | | 455/341 |
| 11,581,877 B1 | 2/2023 | Stoopman et al. | |
| 2003/0001648 A1 * | 1/2003 | Okazaki | H03H 11/22 |
| | | | 327/252 |
| 2003/0117200 A1 | 6/2003 | Koh et al. | |
| 2010/0141337 A1 * | 6/2010 | Chen | H03F 3/211 |
| | | | 330/124 R |
| 2012/0049920 A1 * | 3/2012 | Kurachi | H03H 11/22 |
| | | | 327/254 |
| 2020/0067462 A1 * | 2/2020 | Kawasaki | H03F 3/45 |

OTHER PUBLICATIONS

Zhang, T., A Precision Wideband Quadrature Generation Technique With Feedback Control for Millimeter-Wave Communication Systems, IEEE Transactions on Microwave Theory and Techniques, vol. 66, No. 1, Jan. 2018.

* cited by examiner

*Primary Examiner* — Khanh V Nguyen

(57) ABSTRACT

Disclosed is a four-phase generation circuit, comprising a pair of input ports configured to receive a differential signal having a common mode voltage; a polyphase filter having a pair of polyphase filter input ports and first, second, third and fourth output ports; a first circuit configured to provide the differential signal with an adjusted common mode voltage to the pair of polyphase filter input ports; wherein the first, second third and fourth output ports are each configured to output a square-wave signal, with 90° phase separation between consecutive output signals; and a feedback circuit from the first, second, third and fourth outputs ports to the first circuit; wherein the feedback circuit is configured to provide a feedback signal to the first circuit to set the adjusted common mode voltage from the common mode voltage.

20 Claims, 11 Drawing Sheets

FOUR-PHASE GENERATION CIRCUIT WITH FEEDBACK

CROSS-REFERENCE TO RELATED APPLICATIONS

This application claims the priority under 35 U.S.C. § 119 of European Patent application no. 22166534.2, filed on 4 Apr. 2022, the contents of which are incorporated by reference herein.

FIELD

The present disclosure relates to four-phase generation circuits and method for produced a four-phase or quadrature square-wave signal.

BACKGROUND

A square-wave differential signal with nominally 50% duty cycle may be considered as a pair of square-wave signals having 180° phase separation. Similarly, a four-phase, or four-phase quadrature signal may be considered as a composite of four signals, one in each quadrant of phase, such that the phases are 90° apart, i.e. the signals have phases at 0°, 90°, 180°, and 270°. There are several ways of deriving a four-phase or four-phase quadrature signal. For instance, at low frequencies, this can be done by using an input frequency that is four times higher than the output frequency together with divide-by-two circuits to generate the four signals. For higher frequencies, a polyphase filter can be used to realise a 90° phase difference between two signals derived from a single signal. These signals are typically denoted as the in-phase (I) signal and quadrature (Q) signal respectively. So by starting with a differential square signal having nominal 50% duty cycle, one can achieve the required four-phase quadrature signal, by generating I and Q signals from each.

However, process variations can result in deviations from the intended 90° phase difference in between two outputs of a polyphase filter. It would be desirable to reduce or even eliminate such deviations.

SUMMARY

The present disclosure, there is provided a four-phase generation circuit, comprising a pair of input ports configured to receive a differential signal having a common mode voltage; a polyphase filter (PPF) having a pair of polyphase filter input ports and first, second, third and fourth output ports; a first circuit configured to provide the differential signal with an adjusted common mode voltage to the pair of polyphase filter input ports; wherein the first, second third and fourth output ports are each configured to output a square-wave signal, with 90° phase separation between consecutive output signals; and a feedback circuit from the first, second, third and fourth outputs ports to the first circuit; wherein the feedback circuit is configured to provide a feedback signal to the first circuit to set the adjusted common mode voltage from the common mode voltage. By providing a feedback circuit which is used to adjust the common mode voltage of the differential signal applied to the PPF, the relative phase of the in phase and quadrature outputs of each part of the PPF may be controlled, in order to improve the relative phase accuracy of the four-phase signal.

In one or more embodiments the differential signal is a pair of signals having 50% duty cycle and 180° phase separation therebetween. Use of such a signal may be beneficial in ensuring the relative phases of different parts of the polyphase filter. However, in other embodiments, the duty cycle may vary, for instance by up to about 25%. Moreover, phase separation may vary, for instance by up to about 11°. Typically the differential signal is a square-wave signal, but this need not be the case, particularly in the case of a very low amplitude input signal.

In one or more embodiments the feedback circuit is configured such that, in steady state, the adjusted common mode voltage is midway between a high voltage and a low voltage at a one of the first, second, third and fourth output ports. Typically, the high and low voltage corresponds to a supply voltage such as Vdd and a ground voltage Vgnd or 0 respectively. However, other voltages may be used, such that the outputs of the first circuit and the outputs of the polyphase filter need not swing between Vdd and 0.

In one or more embodiments wherein the feedback circuit comprises an exclusive NOR logic circuit having a respective input coupled to each of the first, second, third and fourth output ports, and an output providing an input to a low-pass filter. In one or more other embodiments, the feedback circuit comprises an exclusive OR logic circuit. The exclusive OR (XOR) or exclusive NOR (XNOR) circuit may be built using any suitable technology, such as but not limited to transmission gates. In one or more embodiments the low-pass filter has a cut-off frequency which is lower than, and may typically be no more than one-fifth, a frequency of the differential signal.

In one or more embodiments the feedback circuit further comprises a operational amplifier, wherein the operational amplifier has an output configured to provide the feedback signal, a first input coupled to the output of the low-pass filter, and second input coupled to the voltage midway between a high voltage and a low voltage at a one of the first, second, third and fourth output ports. The second input may alternative be coupled to a voltage which is midway between a high voltage and a low voltage at the output of the XNOR (or XOR) logic circuit This may be beneficial in ensuring the steady state operation of the feedback circuit. The comparator function may be implemented by any suitable component or components, such as but not limited to an operational amplifier (op-amp).

In one or more embodiments, the first circuit is a differential amplifier circuit. The differential amplifier circuit may comprise a leg for each of a first and second signal of the differential signal, each leg comprising a current source connected to a supply voltage and arranged in series with a switching transistor, the switching transistors having commonly connected sources, the commonly connected sources being coupled to ground through a current sink, wherein the gate of each switching transistor is coupled to a respective one of the first and second signal.

In one or more such embodiments, the gate of each switching transistor is coupled to the respective one of the first and second signal through a respective capacitor and coupled to a common bias voltage through a respective bias resistor. Such a coupling arrangement may improve the signal quality of the input signal. In other embodiments, the biasing may be provided directly as part of the input signal.

In one or more embodiments, the current source of each leg of the differential amplifier circuit is a voltage controlled current source, and the feedback signal is provided as a control signal to each of the voltage controlled current sources. In other embodiments, a single voltage current controlled current source may be provided and the output current from the voltage controlled current source may be inserted into a node of the differential amplifier, thereby adjusting its output common mode voltage.

In one or more embodiments, for each of the first and second signals of the differential signal, the polyphase filter comprises an in-phase branch and a quadrature branch, wherein each branch comprises a filter followed by at least one buffer. The at least one buffer may be inverting or non-inverting. The respective at least one buffer may comprise an even number of inverters. In other embodiments, the buffers are not inverter circuits. In yet other embodiments, the at least one buffer includes a mix of noninverting buffers and inverters. The number of buffers or inverters may be the same for all branches, or may differ between branches.

In one or more embodiments, the filter of each in-phase branch of the polyphase filter comprises low pass filter having a cut-off frequency which is the same as that of the differential signal. Furthermore, in one or more embodiments the filter of each quadrature branch of the polyphase filter comprises high pass filter having a cut-off frequency which is the same as that of the differential signal and comprising a resistor coupled to a quadrature bias voltage. The quadrature bias voltage may be common to each of the quadrature branches.

In one or more other embodiments wherein the filter of each quadrature branch of the polyphase filter comprises high pass having a cut-off frequency which is the same as that of the differential signal, further comprising a resistor in parallel with a first buffer of the at least one buffers. Such or similar embodiments may obviate any requirement for a separate bias control for the quadrature branches.

According to another aspect of the present disclosure, there is provided a generation circuit for generating a four-phase signal, having four signals with a one of a leading edge and a falling edge equi-spaced in phase, from a differential signal pair having a common mode voltage, the generation circuit comprising an amplifier circuit for amplifying the differential signal and adjusting the common mode voltage; a polyphase filter configured to generate an in-phase signal and a quadrature signal from each signal of the differential signal pair; and a feedback circuit, wherein the feedback circuit is configured to combine each of the four signals of the four-phase signal and generate a feedback signal therefrom; wherein the amplifier circuit is configured to adjust the common mode voltage of the differential signal pair in dependence on the feedback signal.

In one or more embodiments, the feedback signal is a voltage midway between a high level and a low level of one of the four signals of the four-phase signal.

In one or more embodiments, the feedback circuit comprises a one of an exclusive NOR circuit and an exclusive OR circuit logic circuit for combining the four signals, and the feedback signals is a voltage midway between a high level and a low level of the one of an exclusive NOR circuit and an exclusive OR circuit logic circuit.

In one or more embodiments, the amplifier circuit is configured to adjust the common mode voltage to equal the feedback signal voltage.

In one or more embodiments, the amplifier circuit comprises first and second switching transistors coupled to respective signals of the differential signal pair, and first and second current generators coupled to respective switching transistors for generating the adjusted common mode voltage.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which FIG. 1 show a schematic block diagram of a four-phase generation circuit comprising a polyphase filter (PPF).

Figure 1:
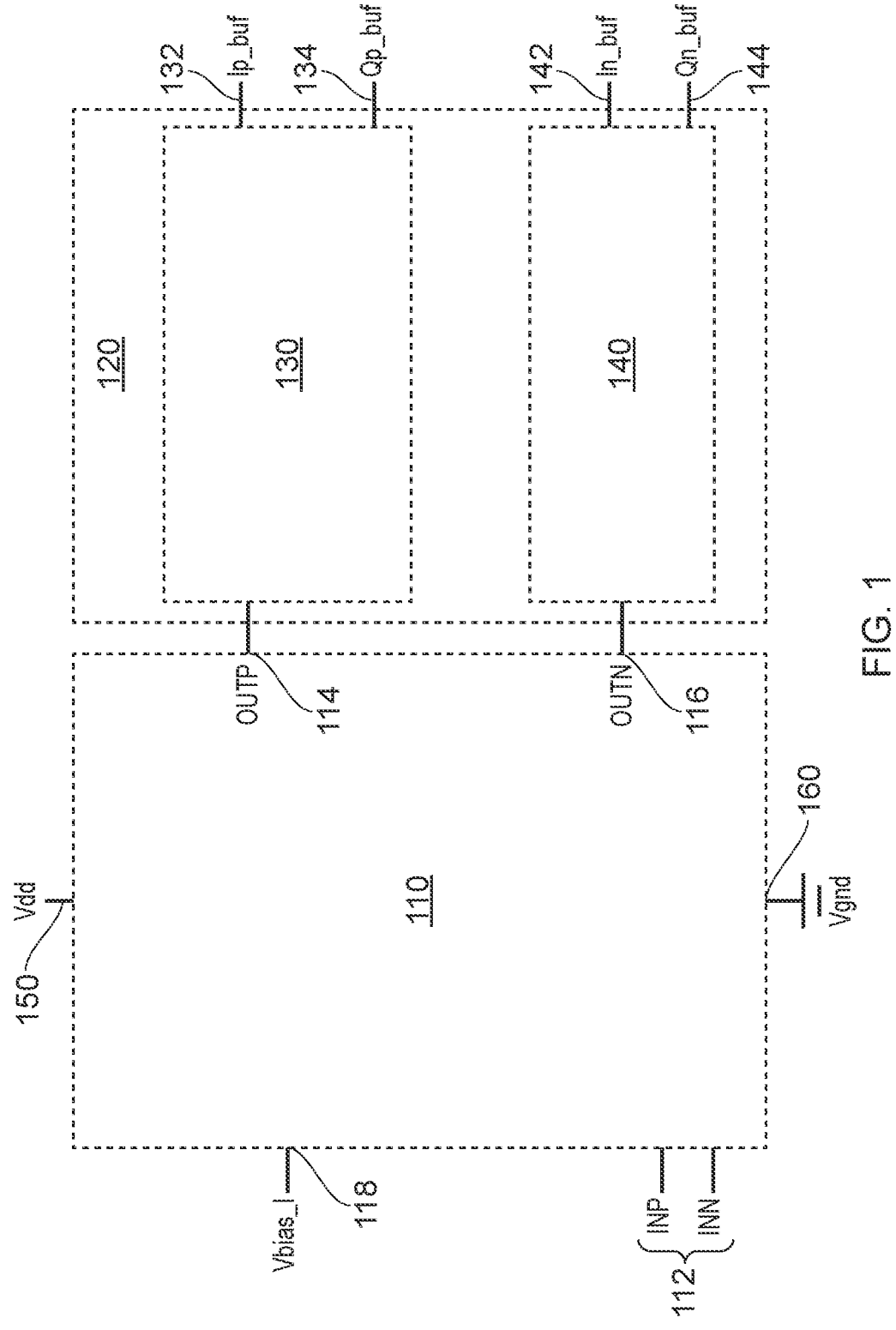

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 shows a schematic block diagram of a four-phase generation circuit 100 comprising a polyphase filter (PPF). The four-phase generation circuit comprises a first circuit 110, together with a polyphase filter, PPF, 120, which is comprised of two parts 130 and 140. A differential signal (INP, INN) is input to the first circuit at input port 112. The first circuit may be an amplifier, as will be discussed in more detail hereinbelow. The first circuit may have an input port 118 for receiving a bias voltage Vbias_I, again as will be discussed in more detail hereinbelow. The first circuit may be connected to a supply voltage Vdd at port 150 and to a ground voltage Vgnd at port 160. A first signal (OUTP) of the processed or amplified differential signal is output from the amplifier at 114 and a second signal (OUTN) is output at 116. The first signal (OUTP) is input into the first part 130 of the PPF 120, and the second signal (OUTN) is input into the second part 140 of the PPF 120. Each part 130, 140 of the PPF 120 separates the respective signal OUTP and OUTN into 2 signals. The two signals are an in-phase and a quadrature signal. First part 130 of PPF 120 outputs an in-phase signal Ip_buf at a first port 132 and a second signal Qp_buf at a second port 134. Similarly the second part 140 of PPF 120 outputs an in-phase signal In_buf at a third output port 142 and a second signal Qn_buf at a fourth output port 144.

Figure 2:
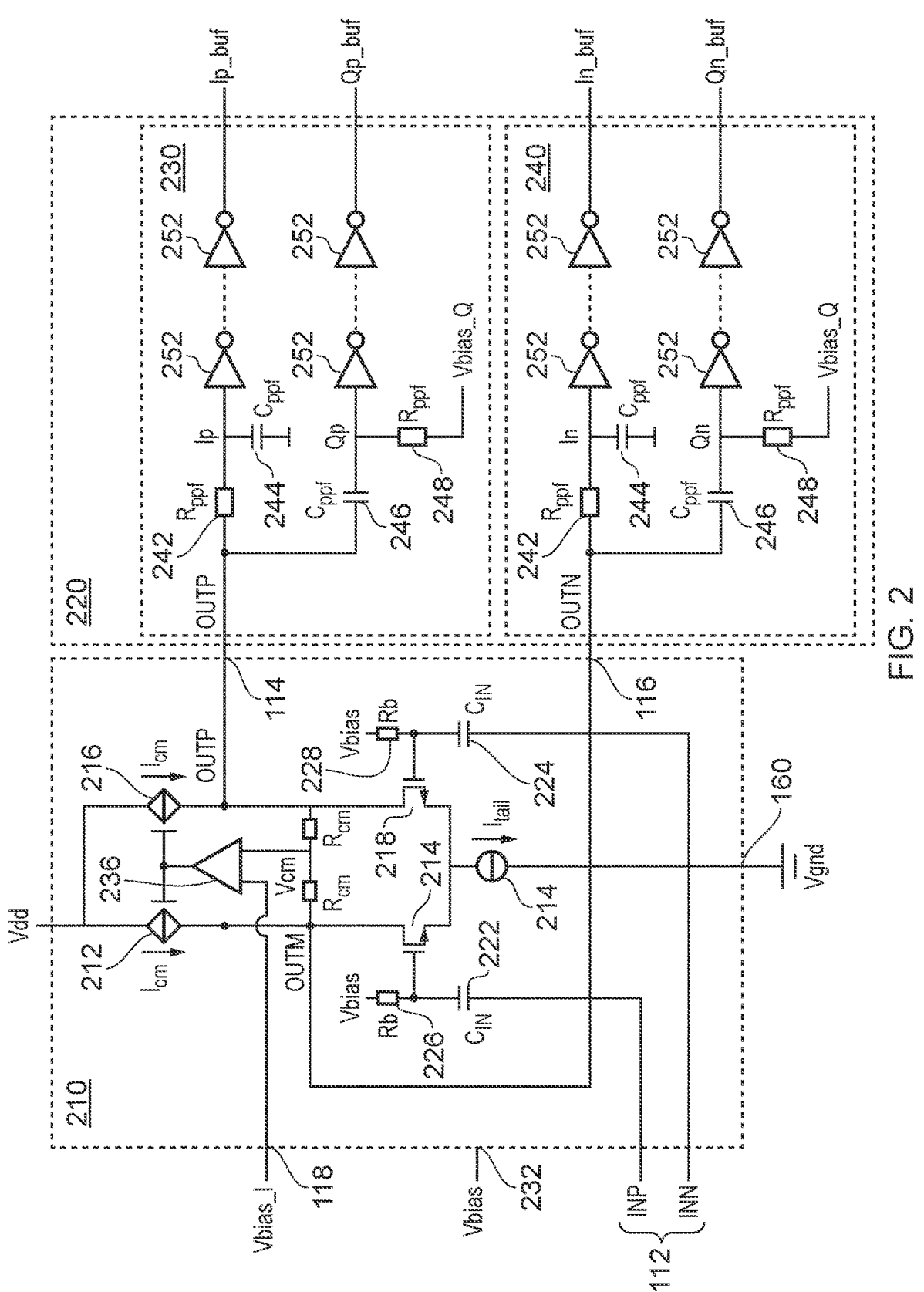
FIG. 2 illustrates the circuit of FIG. 1 in more detail.

The circuit shown in FIG. 1 is shown in more detail in FIG. 2. This figure shows a four-phase generation circuit 200 in which the first circuit 110 is implemented as an amplifier circuit 210. The amplifier circuit 210 shown is a differential amplifier having two branches. A first branch comprises a series arrangement of a first voltage controlled current source 212 with a first switching transistor 214. A second branch comprises a series arrangement of a second voltage controlled current source 216 with a second switching transistor 218. The control inputs at the gates of the switching transistors 214 and 218 are connected to the first (INP) and second (INN) signals of the differential input through respective coupling capacitors $C_{IN}$ 222 and 224. The control input gates of the switching transistors 214 and 218 are also connected to a bias voltage Vbias, provided at port 232 through respective bias resistors $R_b$ 226 and 228. The sources of the switching transistors 214 and 218 are commonly connected through a current source (which may operate also referred to as a current sink) 234, which sinks a current $I_{tail}$, to a ground connection 160 for connection to ground Vgnd. The current sources 212 and 216 provide a common mode current $I_{CM}$. The amplifier outputs OUTP and OUTN are provided to ports outputs 114 and 116 from the nodes between the respective switching transistor 214, 218 and voltage controlled current source 212, 216. The common voltage to control each of the voltage control current sources 212 and 216 is provided by the outputs of an operational amplifier (opamp) 236. The opamp has the bias voltage Vbias_I at input 118 as a first input. The second input, $V_{CM}$ is taken from the centre node of a resistive divider formed from two resistors $R_{CM}$ connecting the output nodes 114 and 116.

The PPF 220 is formed of two parts 230 and 240, corresponding to parts 130 and 140 shown in FIG. 1. First part 230 has as input the signal OUTP from the first circuit or amplifier, and from this input it provides two corresponding signals in quadrature, Ip_buf and Qp_buf. Similarly, the second part 230 has as input the signal OUTN from the first circuit (amplifier), and from this input provides two corresponding signals in quadrature, In_buf and Qn_buf. Each part 230, 240 of the PPF 120 comprising a low pass filter (LPF) and a high pass filter (HPF). Each of the filters is comprised of a resistor $R_{ppf}$ 242, 246, and a capacitor $C_{ppf}$ 244, 248. In the case of the low pass filter the resistor 242 is in series and the capacitor 244 is connected to ground, and in the case of the high pass filter, the capacitor 248 is in series and the resistor 246 is connected to a bias voltage Vbias_Q. The filters all have a cut-off frequency that is the same as the input frequency, that is to say: f_in=1/$(2\pi R_{ppf} C_{ppf})$. At the cut-off frequency, OUTP is shifted plus 45° by the LPF to signal Ip and minus 45° to the signal Qp. Likewise, OUTN is shifted plus and minus 45° to In and Qn. The phases of these four signals will therefor make 90° steps in the order Qp, Ip, Qn, In. The output of the filters is then buffered by a buffer or plurality of buffers 252. In the implementation shown, the buffers at the output of each filter are a chain of an even number of inverters.

Figures 3, 4:
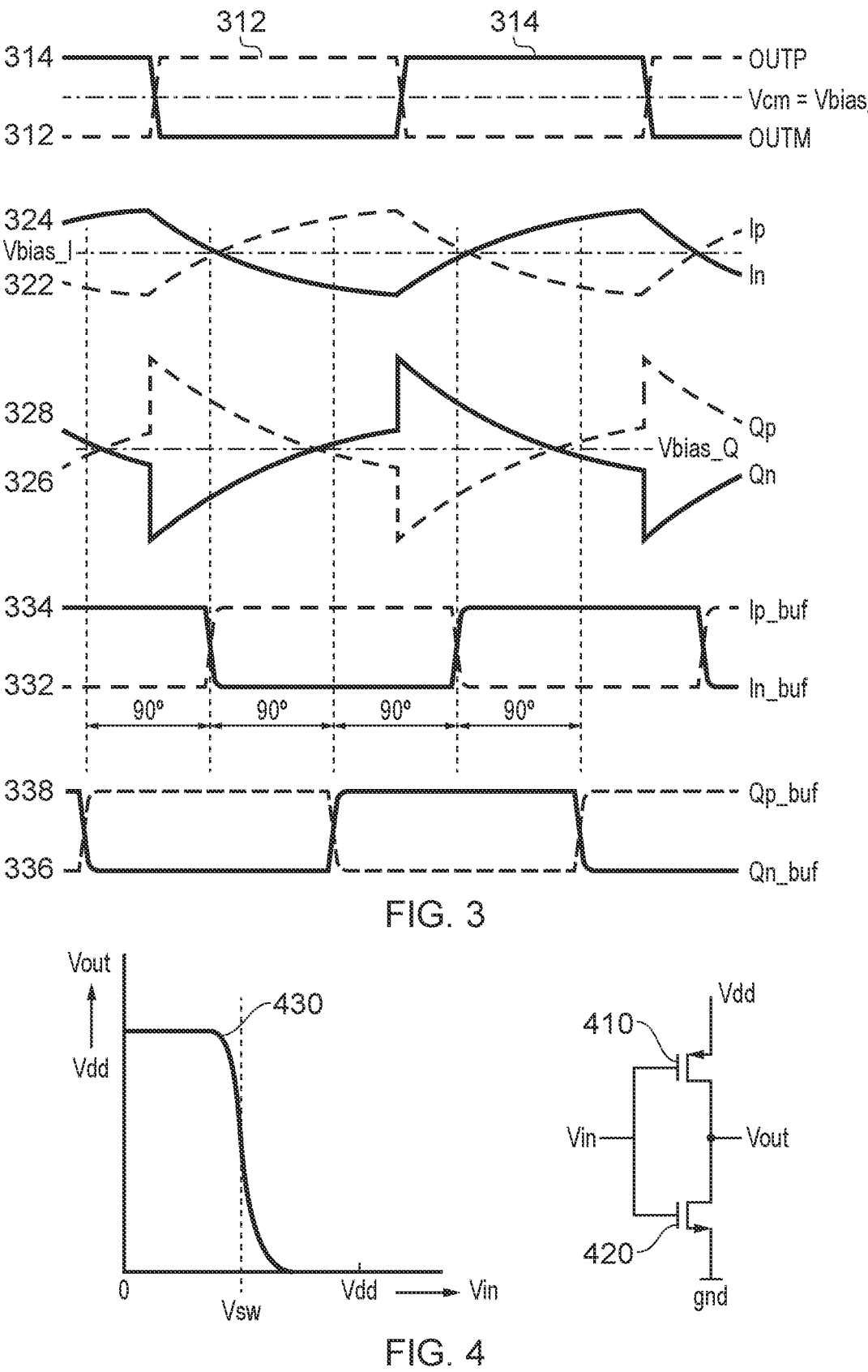
FIG. 3 shows various waveforms associated with the circuit of FIG. 2.
FIG. 4 shows a typical inverter circuit along with its transfer function.

FIG. 3 shows various waveforms associated with the circuit of FIG. 2. The top waveforms on the figure shows, at 312 and 314 the outputs OUTP and OUTN from the first circuit, which, as can be seen, each are a square wave with 50% duty cycle and separated by 180° phase difference. Together they form a differential pair which has a common mode voltage Vcm, midpoint between the respective high and low values of the signals, and which is equal to Vbias_I.

Waveforms 322 and 324 show the voltages Ip and In at the outputs of the low pass (in-phase) filters for OUTP and OUTN respectively. The midpoint is set by Vbias_I. Similarly, waveforms 326, 328 show the voltages Qp and Qn, at the outputs of the high pass (quadrature) filters for OUTP and OUTN respectively. The midpoint for these two signals is set by Vbias_Q.

Waveforms 332 and 334 show the signals 322 and 324 after buffering, to provide Ip_buf and In_buf. The buffering ensures that the output signal is high whenever the input signal is more than Vbias_I and low whenever the input signal is less than Vbias_I. Similarly, waveforms 336 and 338 show the signals 326 and 328 after buffering, to provide Qp_buf and Qn_buf. The buffering ensures that the output signal is high whenever the input signal is more than Vbias_Q and low whenever the input signal is less than Vbias_Q.

As mentioned above, the buffers are conveniently implemented as inverters and even more conveniently as pairs of inverters. FIG. 4 shows a typical single inverter circuit along with its transfer function. The inverter comprises a pair of transistors 410, 420 in series between a ground connection (at Vgnd or 0) and a supply connection (at Vdd). As shown in the transfer function 430, the output voltage Vout remains high as the input voltage Vin increases from 0 (or Vgnd), until it approaches the switching voltage Vsw at half Vdd, at which voltage it rapidly falls to 0, and remains at zero as the input voltage increases to Vdd.

A potential drawback of the circuit shown in FIG. 2 is that the phase difference between the I and Q signals can differ from 90°. There are several potential reasons for this: firstly, the shape of the input signals of the PPF may differ from that shown in FIG. 3. The two signals OUTP and OUTN in this figure (these are the input signals for the PPF) are inverse to each other but there can be a difference in rise and fall times and other aspects that disrupt the 90° phase difference at the output of the PPF. Also, the I and Q outputs of the PPF may have different amplitudes and shapes. This could have an impact on the delay between the moment that one of these signals crosses the voltage Vsw at the input of the first inverter following the PPF and the moment its output changes state. Such differences in delay time across the inverters would result in an additional phase error. Further, the RC product $R_{ppf} C_{ppf}$ is chosen to be equal to $1/(2\pi \cdot f\_in)$. However, parasitic components such as the input capacitance of the first inverter stage could change this product. The impact could be different for the I- and Q-signals. And yet further, the resistors and capacitors of the PPF are generally realized in an IC. Within an IC, an RC product can vary as much as 40% over manufacturing process corners. This also can affect the output phase difference of the PPF. Overall, the phase error between the I and Q channel can be significant, for instance up to 10°-20° degrees or more.

Furthermore, the circuit of FIG. 2 is susceptible to noise. Any noise on the common mode voltage at the output of the PPF, will be transferred into phase noise at the outputs of the inverter chains.

Figure 5:
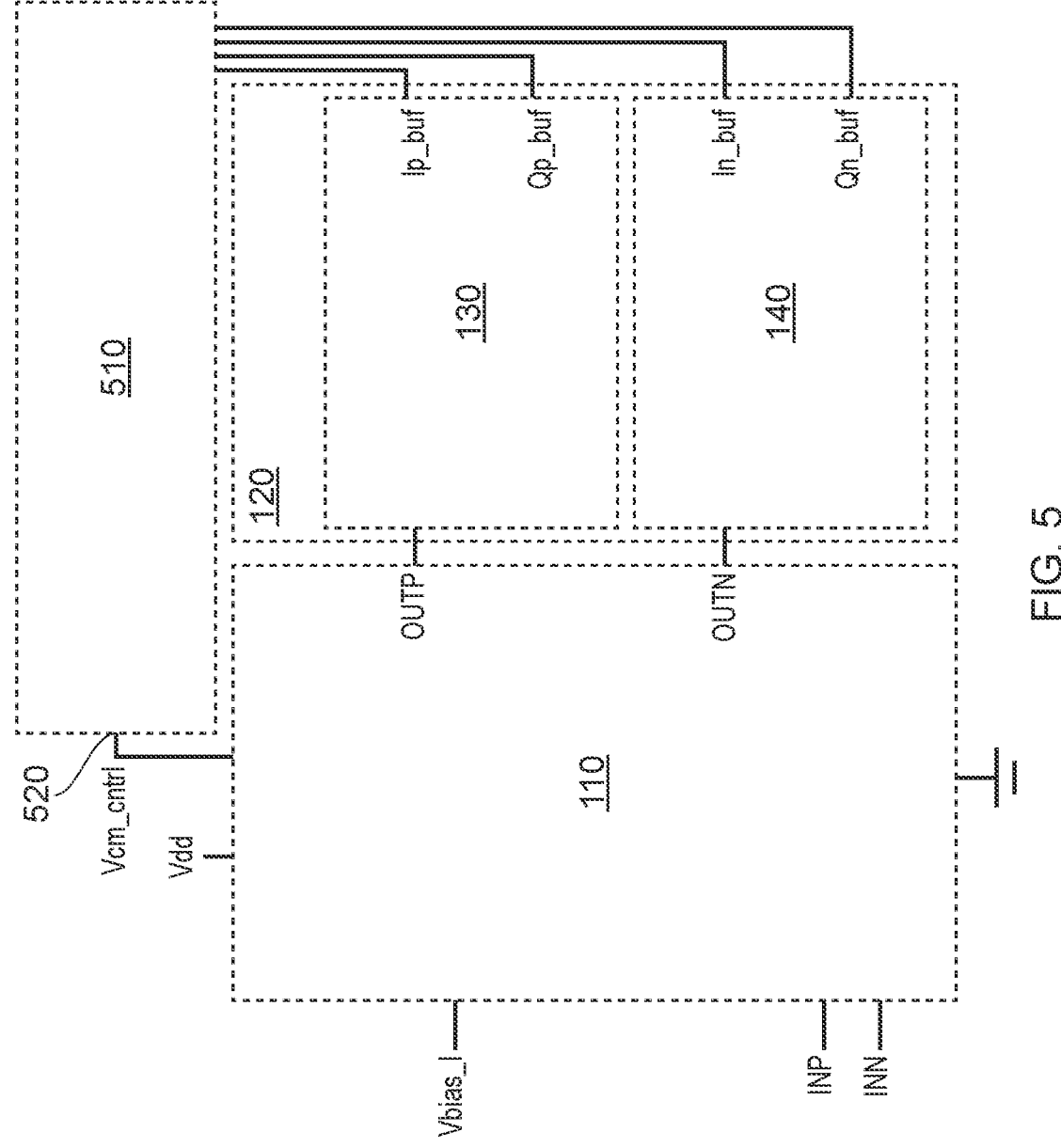
FIG. 5 shows a block diagram of a four-phase circuit according to an embodiment of the present disclosure.

FIG. 5 shows a block diagram of a four-phase circuit according to an embodiment of the present disclosure, in which a common mode feedback loop is provided that sets the common mode input voltage of the PPF. This is used to tune the phase difference between the buffered I and Q signals to 90° degrees. FIG. 5 is a similar to the block diagram of FIG. 1 except that the signals (Ip_buf, Qp_buf, In_buf, and Qn_buf) at the first, second, third and fourth output ports are all connected to a feedback circuit 510. The feedback circuit is configured to provide a feedback signal, Vcm_cntrl, to the first circuit 110, to determine the common mode voltage of the signals OUTP and OUTN (viewed as a differential signal), output from the first circuit 110 to the PPF 220. In other words, the signal Vcm_cntrl modifies the common voltage of the inputs differential signal pair (INP, INN), to ensure the PPF switches the state of the output signals at 90°.

Figures 6A, 6B:
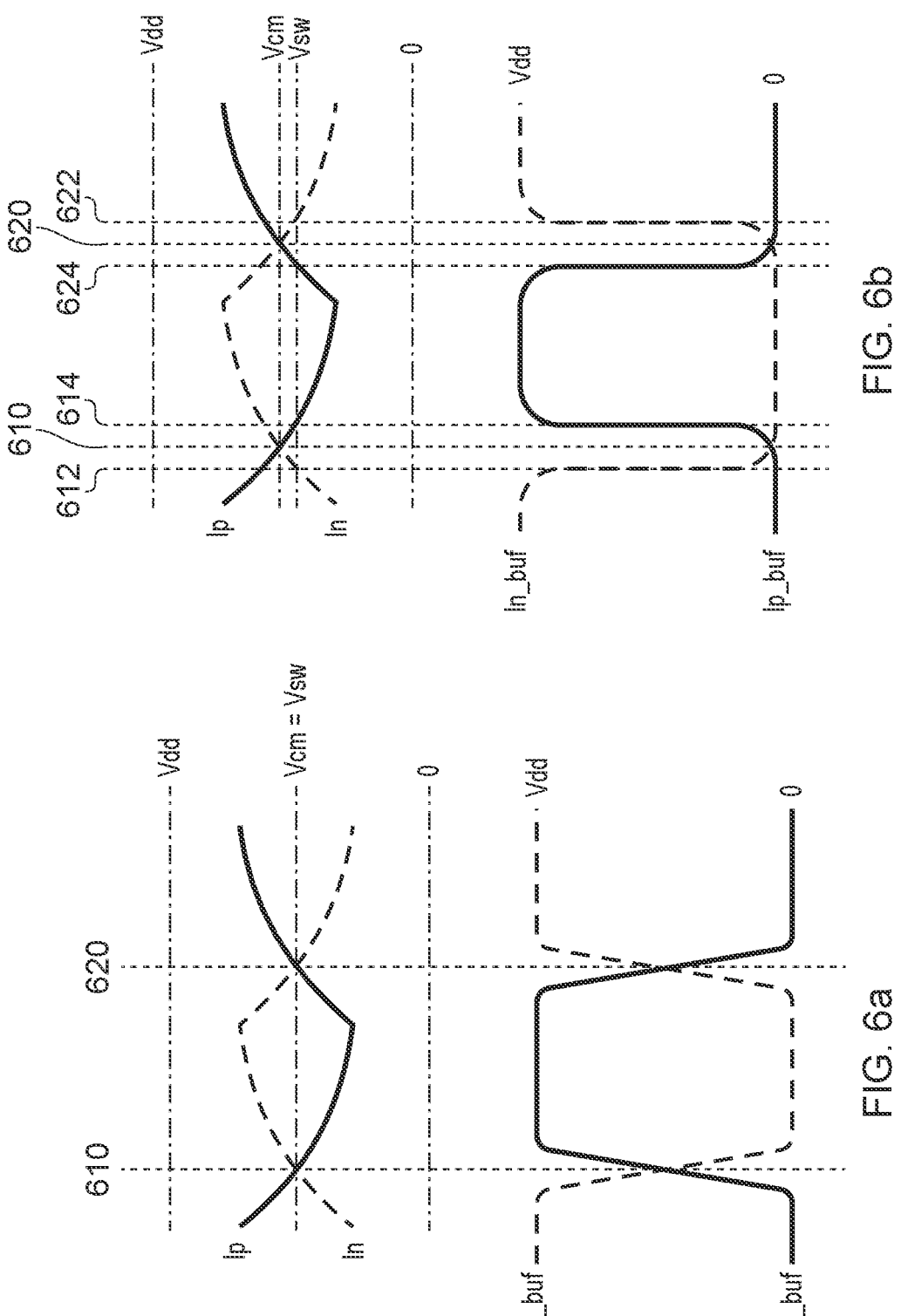
FIG. 6a shows invertor input and output signals, for a case in which Vcm equals Vsw.
FIG. 6b shows invertor input and output signals, for a case in which Vcm differs from Vsw.

Embodiments of the feedback circuit will be shown in more detail hereinbelow. But first consider FIG. 6*a* and FIG. 6*b*, which are useful for understanding a principle underlying the present disclosure. FIG. 6*a* shows invertor input and output signals, for a case in which Vcm equals Vsw, and FIG. 6*b* shows invertor input and output signals, for a case in which Vcm differs from Vsw. The inverter following the PPF will switch at the intended cross-over point when the common mode input voltage of this inverter is the same as the switch level Vsw, as shown at 610 and 620 on FIG. 6*a*. When this is not the case, the moment that the inverter changes state is shifted in time. This is shown in FIG. 6*b* where the inverter input common mode voltage Vcm is chosen to be higher than Vsw. Note that FIG. 6 for the inverting case with an odd number of inverters, whereas FIG. 6*a* is drawn for the non-inverting case, with an even number of inverters, In this case one inverter, having input Ip, changes state, as shown at 612, prior to the "Vcm" moment 610, and the other inverter, having input In, changes state at a moment 614 which is later than the Vcm moment 610. Around the other crossover time 620 the switching moments again are shifted in time, but in the opposite directions. That is to say the inverter having input Ip changes state, as shown at 622, later than the "Vcm" moment 620, and the inverter having input In changes state at the moment 624 which is prior to the Vcm moment 620. This mechanism can be used to correct the I-Q phase relation at the output of the inverter chains. Note that the pulse width may also be affected when Vcm differs from Vsw: the duty cycle can differ from 50%. The mechanism is therefore primarily useful when the duty cycle of the output signals does not have to be very accurate and thus when there is a need for accurate phase relations only between the positive-going slopes or between the negative-going slopes, but not both. In other words, when Vcm is not identical to Vsw (as shown in this FIG. 6*b*), the output signals do not switch at the same time and the output duty cycle is not 50%. This illustrates what happens when the loop changes the common mode voltage at the input of the (I-channel) inverters: we are able to adjust the phases of Ip and In (relative to Qp and Qn) but the duty cycle is not 50% anymore.

As mentioned, the common mode voltage at the I-outputs of the PPF is the same as the common mode voltage at the input of the PPF. The common mode voltage at the Q-outputs of the PPF may be set separately by Vbias_Q, as shown in FIG. 2. This means that if the input common mode voltage of the PPF is varied, only the I-output common mode voltage varies while the Q-output common mode voltage remains fixed. Varying the input common mode voltage of the PPF therefor results in a shift of zero crossings in the I-channel only. This property may be used to adjust the phase relation between I and Q.

Figure 7:
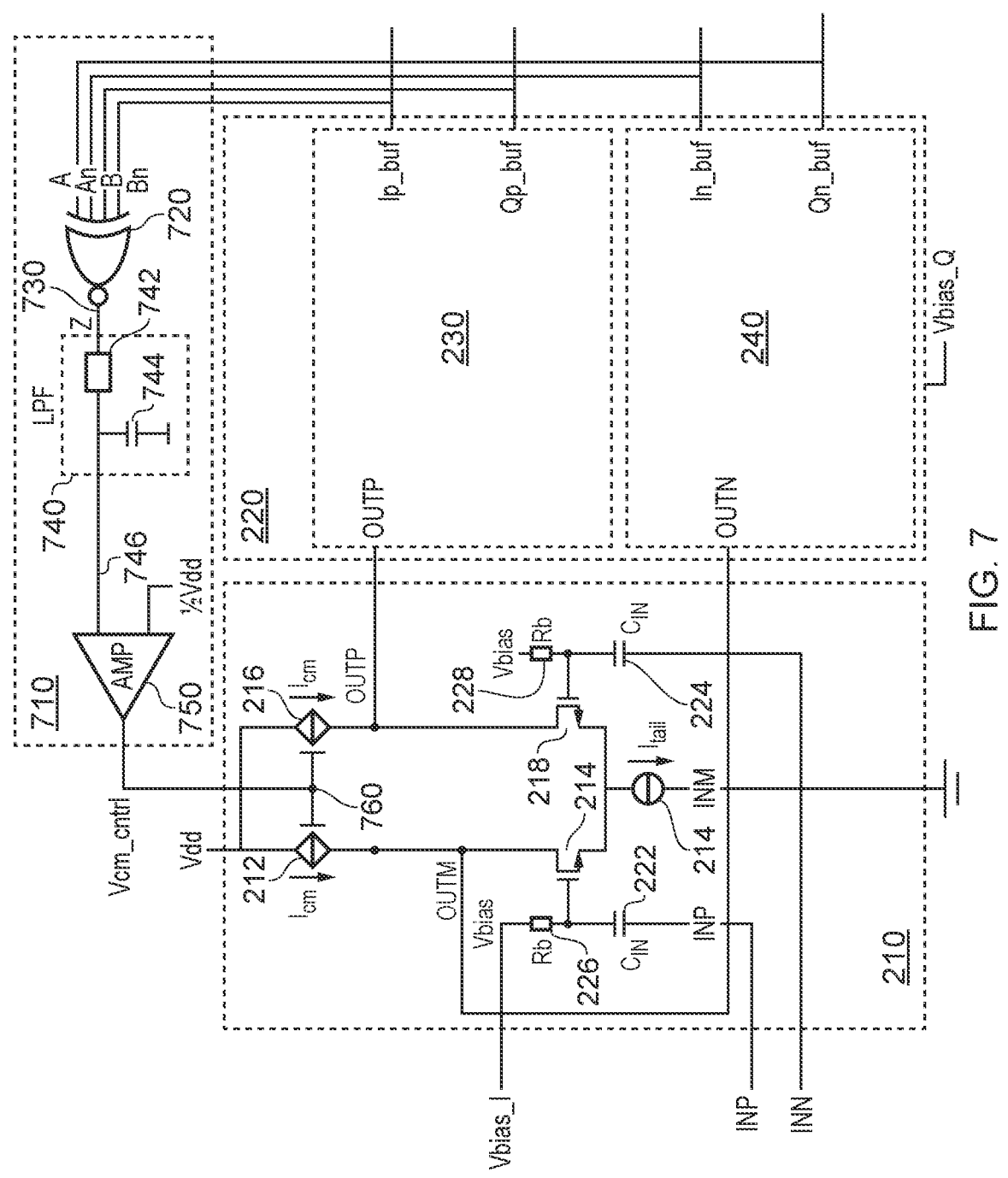
FIG. 7 illustrates a four-phase circuit according to one or more embodiments.

FIG. 7 illustrates a four-phase circuit according to one or more embodiments, partly as a block diagram and partly at circuit-level. As can be seen, the circuit diagram of FIG. 7 shows parts of the circuit of FIG. 5 in more detail. The PPF 220, having the two parts at 230, 240, is the same as that shown in FIG. 2 so will not be described in more detail. As shown in FIG. 5, the signals (Ip_buf, Qp_buf, In_buf, and Qn_buf) at the first, second, third and fourth output ports are all connected to a feedback circuit. The feedback circuit 710 shown in this embodiment comprises an exclusive NOR logic circuit 720 having a respective input, Bn 722, B 724, An 726 and A 728 coupled to each of the first, second, third and fourth output ports, and an output 730 providing an input to a low-pass filter 740. The low-pass filter is designed to have a cut-off frequency which less than the frequency f_in of the input differential signal. In one or more embodiments, the low-pass filter is designed to have a cut-off frequency which is no more than one-fifth f_in, and in some practical implementations 1 GHz, or a value which is $\frac{1}{10}^{th}$ f_in has been found to be effective. The low pass filter may be of any suitable type, as will be familiar to the skilled person. As shown it may comprise a series resistor 742, along with a shunt capacitor 744 connecting the output of the series resistor 742 to ground.

The feedback circuit 710 may further comprise a operational amplifier (opamp) 750 as shown, having an output configured to provide the feedback signal Vcm_cntrl, a first input coupled to an output 746 of the low-pass filter, and a second input coupled to the voltage midway between Vdd and Vgnd. So if Vgnd is 0, the second operational amplifier input is ½. Vdd. Furthermore, the output (and the first, second, third and fourth output ports), typically has Vdd as a "high" value (or logical "1") and Vgnd or 0 as a "low" value (or logical "0"). ½·Vdd can therefore also be described as being halfway between a high voltage and a low voltage at one of the first, second, third and fourth output ports. The operational amplifier acts as a comparator feeding back a signal whose sign depends on whether the low-pass filtered signal 746 is greater or less than ½·Vdd. It thereby drives the low-pass filtered signal 746 towards ½·Vdd, as will be familiar to the skilled person, and the opamp and first circuit components (for instance the resistive divide pair 1016, 1018 shown in the embodiment of FIG. 10) are dimensioned appropriately. The feedback signal Vcm_cntrl is used to drive the common mode current source or sources of the input amplifier (as explained below). The loopgain is sufficiently high to ensure the loop settles when the LPF voltage is half the supply voltage which corresponds to a 90 degrees phase relation between the upgoing slopes of the I and Q signals.

As already mentioned, in the embodiment shown in FIG. 7, the first circuit is a differential amplifier circuit. In this embodiment, the differential amplifier circuit comprises a leg for each of the first and second signal of the differential signal, each leg comprising a current source 212, 216, connected to a supply voltage and arranged in series with a switching transistor 214, 218, The switching transistors have commonly connected sources, the commonly connected sources being coupled to ground through a current sink 234. The gate of each switching transistor is coupled to a respective one of the first INP and second INN signal. The gate of each switching transistor is coupled to the respective one of the first and second signal through a respective capacitor 222, 224 and coupled to a common bias voltage through a respective bias resistor 226, 228. The current source of each leg of the differential amplifier circuit is a voltage controlled current source, and the feedback signal is provided as a common control signal to each of the voltage controlled current sources.

Figures 8A, 8B, 8C:
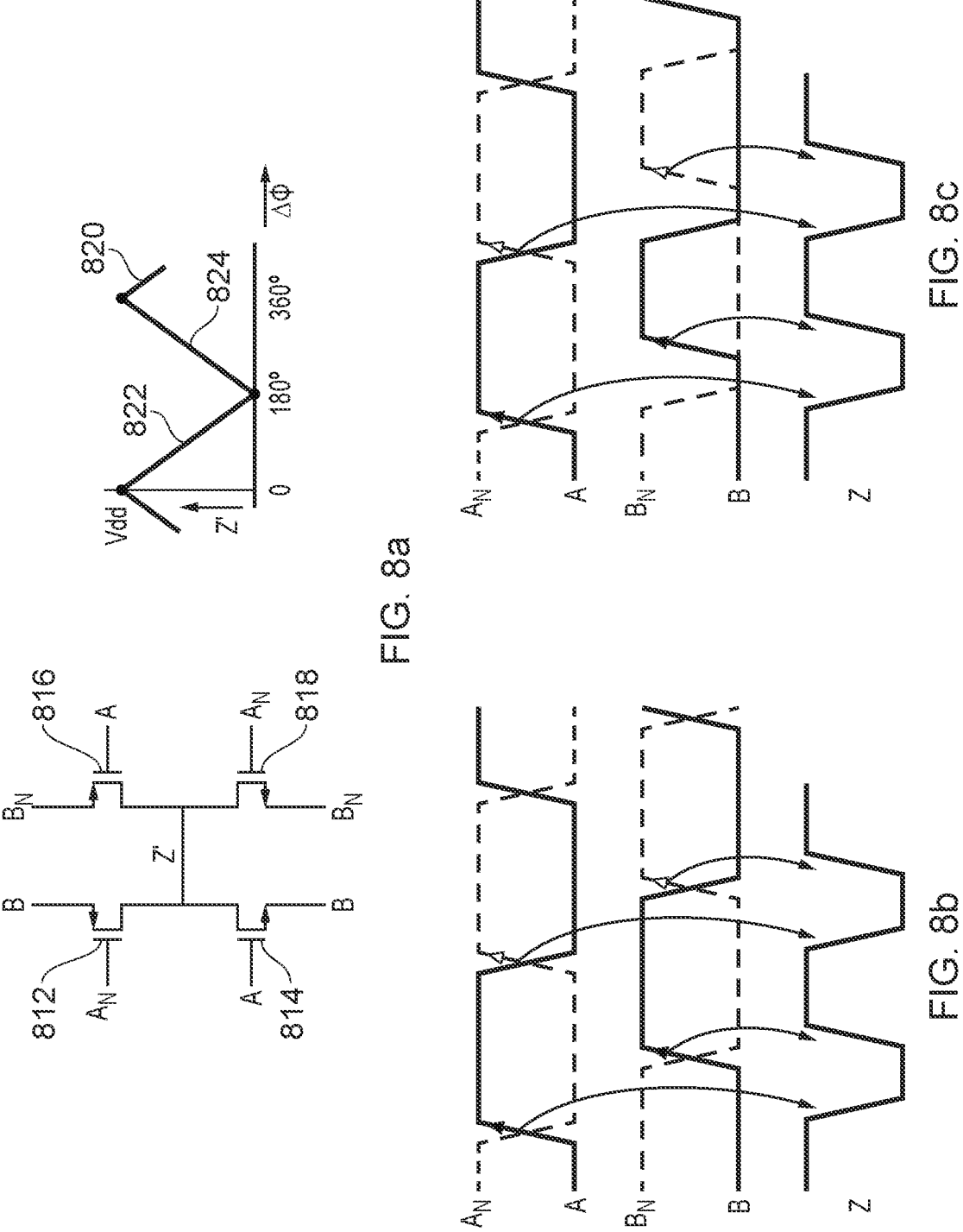
FIG. 8a shows construction and operation of an example exclusive NOR (XNOR) circuit.
FIG. 8b shows a dependence of the output of the XNOR on inputs with 50% duty cycle.
FIG. 8c shows a dependence of the output of the XNOR on inputs with duty cycles which deviate from 50%.

One, non-limiting, implementation of the exclusive NOR circuit, using FETs and pass-gate logic, and its operation, may be understood with reference to FIG. 8a, FIG. 8b, and FIG. 8c. The exclusive NOR circuit (XNOR) is made in an H configuration, with two legs each comprising two FETs (812 and 814, 816 and 818) in series, with a common crossbar (output node Z) therebetween. The diagonal control terminals are commonly connected, such that control terminals of 812 and 818 are connected to input An, and those of 814 and 816 are connected to A. A and B in this figure refer to the leading and lagging input respectively, so for instance A may correspond to the Ip_buf signal at the first output of the four-phase circuit, An to the In_buf signal at its second output, B may correspond to the Qp_buf signal at its third output, and Bn to the Qn_buf signal at its fourth output.

The top and bottom of each leg are connected to a respective B or Bn input (that is to say, the sources of 812 and 814 are connected to B and the sources of 816 and 818 are connected to Bn). The variation of the low pass filtered Z' version of output node Z with the relative phase difference between the input A and B is shown at the right-hand side at 820. As can be seen, when the phase difference is in the second quadrant (i.e. less than 180°), the XNOR output has a negative slope, whereas when the phase difference is in the third quadrant the XNOR output has a positive slope.

In operation, as can be seen in FIG. 8b, the output Z of the XNOR circuit goes high in response to a rising edge of either input B or Bn, and goes low in response to a rising edge of either A or An input. The operation of the X nor has been redrawn in FIG. 8c, but in this instance the duty cycle of each of the signals A, An, B, and Bn have been modified relative to FIG. 8b. As can be seen the figure, the output Z from the XNOR circuit is not affected by the change in duty cycle of the input signals.

Figure 9A:
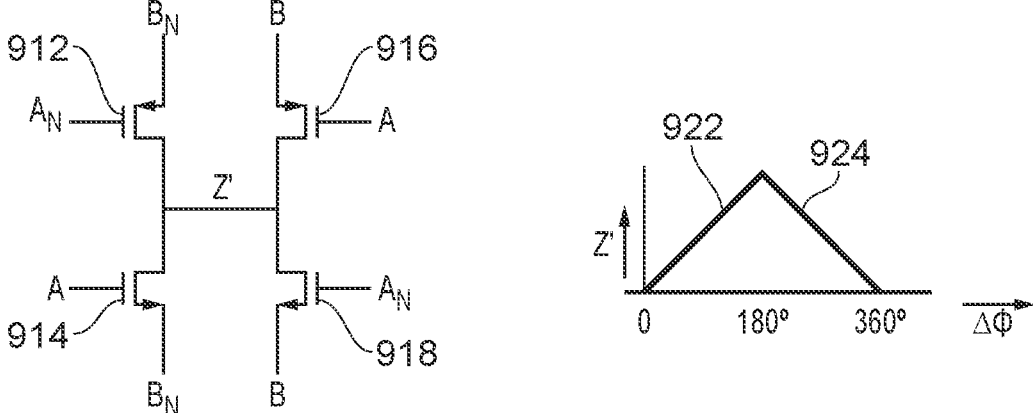
FIG. 9a shows construction and operation of an example exclusive OR (XOR) circuit.

FIG. 9a shows an alternative logic circuit which may be used in the feedback circuit 59 according to one or more other embodiments. This circuit is configured to provide an output Z which is triggered by negative going edges of the inputs, and operates as an exclusive OR (XOR) circuit.

Figure 9B:
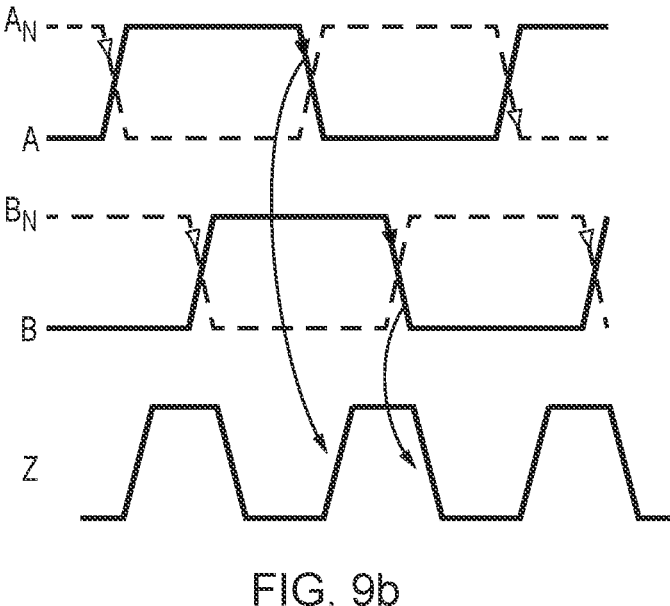
FIG. 9b shows a dependence of the output of the XOR on inputs with 50% duty cycle.

Similar to the circuit of FIG. 9A, the circuit comprises an H configuration of four FETs 912, 914, 916 and 918 with the output Z taken from a centre node at the crossbar. However, compared to the circuit shown in FIG. 8a, the inputs B and Bn are switched. The right-hand side of the figure shows the low pass filtered XOR output. In operation, as can be seen in FIG. 9b, the output Z of the XOR circuit goes high in response to a falling edge of either input A or An, and goes low in response to a falling edge of either B or Bn input.

Figure 10:
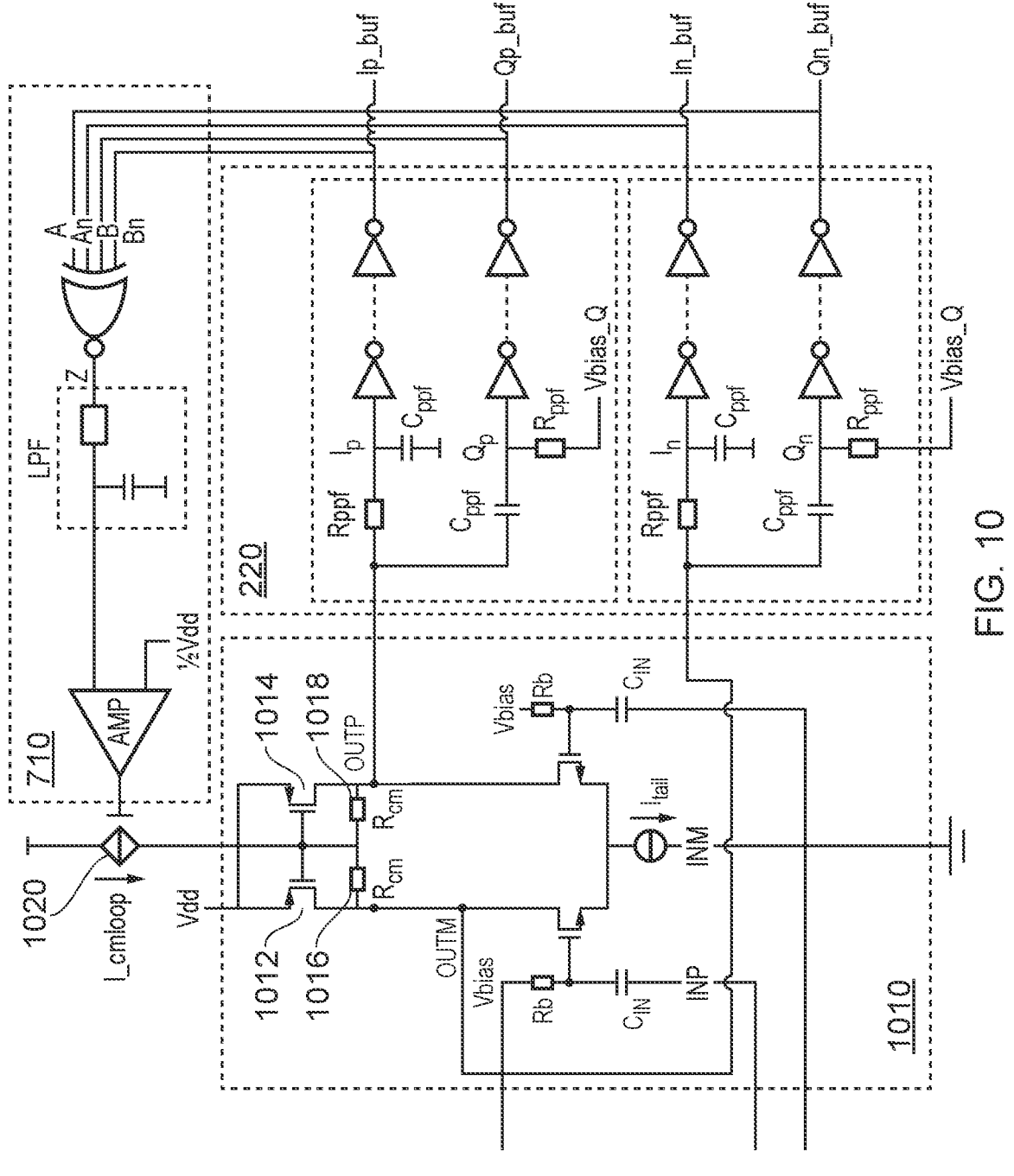
FIG. 10 illustrates a four-phase circuit according to other embodiments.

FIG. 10 illustrates a four-phase circuit according to one or more other embodiments. The PPF 220 including a first part 230 and second part 240 is the same as that in the embodiment shown in FIG. 7, as is the feedback circuit 710. However, in this instance the first circuit 1010 includes a pair of p-type FETs 1012, 1014 in place of the first second voltage controlled current sources 212, 214. The gates of the FETs are commonly controlled through a single voltage controlled current source 1020 which produces a current I_cmloop. The output of the voltage controlled current source is connected to the gates of both FETs 1012, 1014, and to the centre-tap of a voltage divider formed of two resistors RCM 1016 and 1018. The voltage divider is connected between the two outputs OUTP and OUTN of the first circuit. The input common mode voltage of the PPF in this example is {Vdd−Vgs−I_cmloop*Rcm/2}, where Vgs is the source to gate voltage of the p-type FETS.

Figure 11:
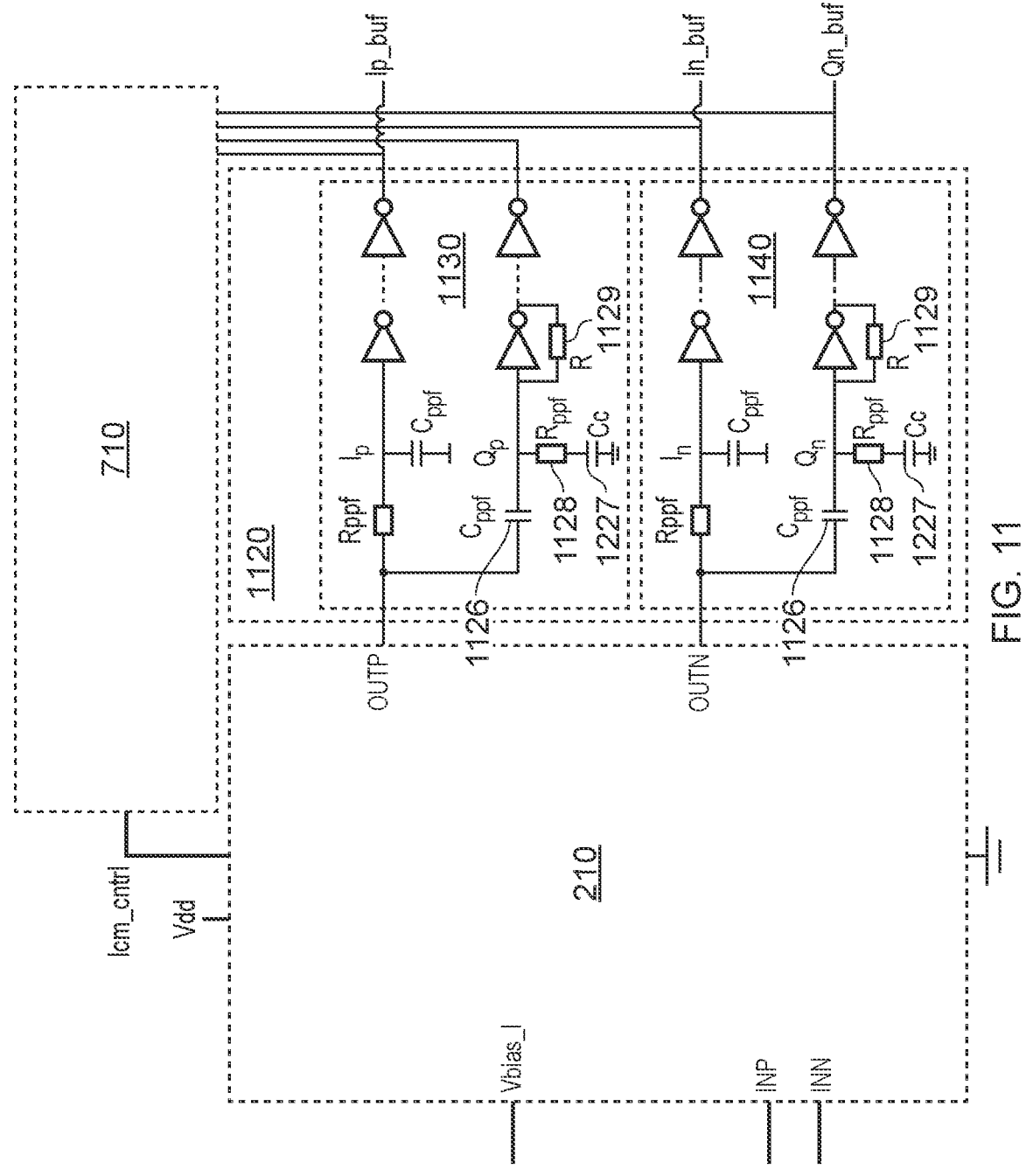
FIG. 11 illustrates a four-phase circuit according to yet other embodiments.

FIG. 11 illustrates a four-phase circuit according to one or more yet other embodiments. In this embodiment, the feedback circuit 710 is the same as that of the previous embodiments. And the first circuits 210 the same as in other embodiments. However, the PPF 1120 is different from that described in previous embodiments and in particular the quadrature circuits of each of the first part 1130 and 1140 are not driven by a separate bias voltage VbiasQ. In this embodiment, the common mode output voltage of the Q-signal of the ppf is not fixed by connecting resistors Rppf to Vbias_Q (=Vsw). As will be apparent from the figures above related to the XNOR (or XOR) logic in the feedback circuit, the Q-signals may have a duty cycle that differs from 50%, and the logic only responds to only one of the positive-going and negative-going set of slopes.

One practical implementation is to place a resistor R 1129 between the input and output of the first inverter, and include a coupling capacitor Cc capacitor 1127 between Rppf 1128 and ground.

Another way to bias the Q-signals is to connect the Rppf resistors in the Q-section of the polyphase filter to any convenient voltage node (such as ground, for instance), and connect the polyphase filter Q-outputs with a coupling capacitor Cc 1124 to the first inverters of the inverter chains (although in this implementation, the additional coupling capacitor in the path could degrade the signal).

Figure 12:
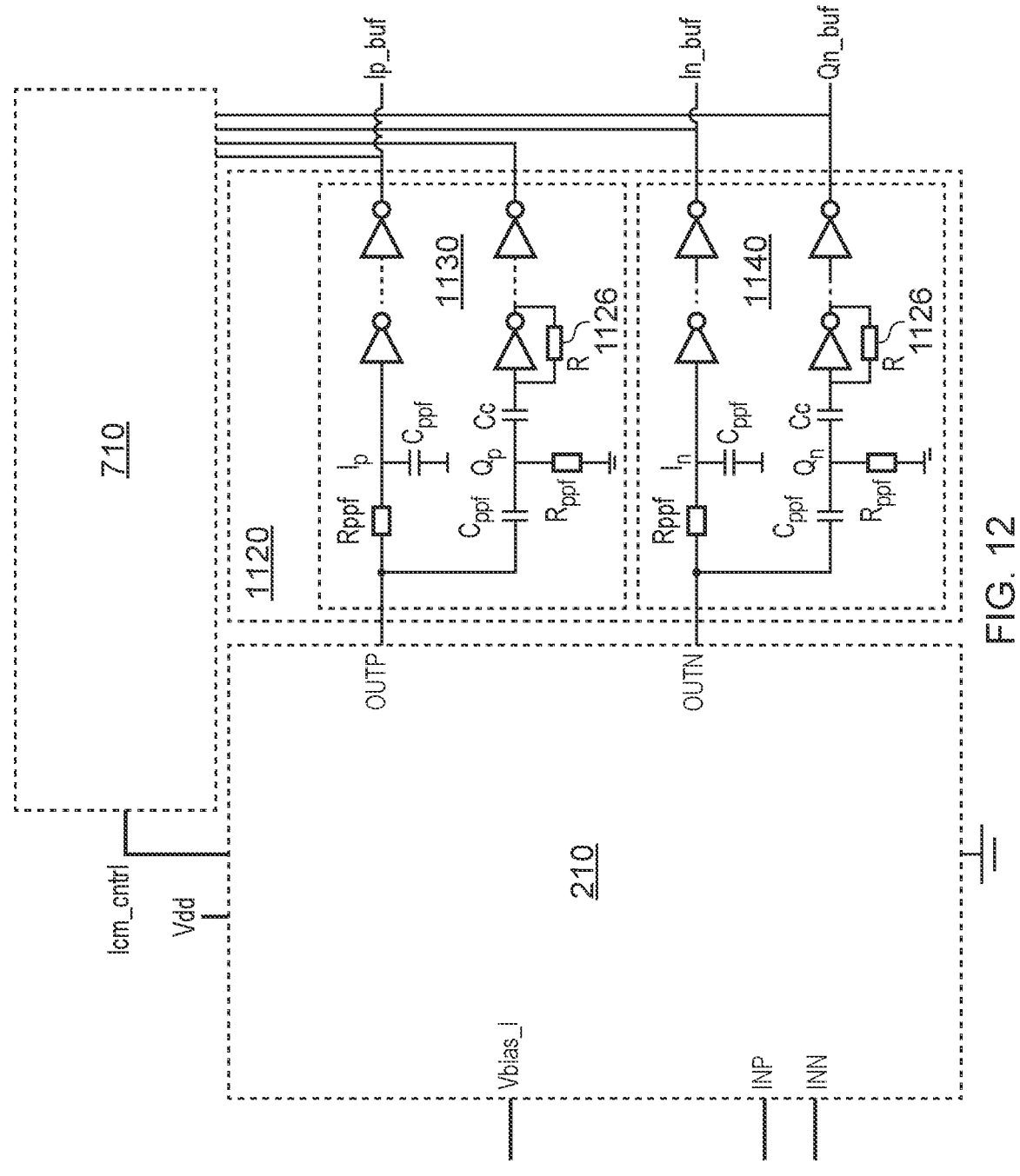
FIG. 12 illustrates a four-phase circuit according to yet other embodiments.

FIG. 12 illustrates a four-phase circuit according to one or more yet other embodiments The circuit is similar to that shown in FIG. 11, except that in this case, the coupling capacitor Cc 1227 in each Q-branch is connected between the Cppf/Rppf filter 1126/1128 and the first inventor As already mentioned, the first circuit need not be an amplifier circuit. Rather, embodiments only require that it is possible to present the input signal differentially at the input of the polyphase filter and have a way to adjust its common mode voltage. The embodiments shown above with a differential input amplifier with nmos transistors and two pmos common mode current sources merely illustrate one, non-limiting, way to do so.

The skilled person will appreciate that the output phase difference between positive-going (or negative-going) slopes may be accurately fixed by a feedback loop, as described above, according to one or more embodiments.

It will also be appreciated that the loop adjusts the phase of the I-signals in such a way that it differs 90° from the Q-signals. As a result, as long as the loop is active, the I-signals follow all phase variations of the Q-signals, which may result in improvements in noise performance: when the Q-signals contain phase noise, the loop will make sure that the phase noise from the Q-channel is duplicated to the I-channel, to the extent that this is possible within the loop gain and bandwidth. As explained above, common mode amplitude variations at the input of the buffers or inverter chains are converted to phase variations at the output of the buffer or inverter chains. The PPF however is a high pass filter for the Q channel, so only common mode phase noise with a frequency above the cut-off is not attenuated at the input of the Q-channel inverter chains. The PPF is a low pass filter for the I-signals, so all common mode amplitude noise below the cut-off is not attenuated at the input of the I-channel inverter chains. The low frequency noise (that is to say, noise up to the PPF frequency which corresponds to the input frequency (typically, this is a relatively high frequency, such as 10 GHz) is much more than the noise at high frequencies (i.e. greater than 10 GHz in the above example). As a result, both the I and Q signals have the low phase noise spectrum normally only present in the Q-signals.

From reading the present disclosure, other variations and modifications will be apparent to the skilled person. Such variations and modifications may involve equivalent and other features which are already known in the art of multiphase filter circuits, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims. Furthermore, the word "may" is used in a permissive sense (i.e., meaning having the potential to), rather than the mandatory sense (i.e., meaning must). Similarly, the words "include," "including," and "includes" mean including, but not limited to.

The invention claimed is:

1. A four-phase generation circuit, comprising:
a pair of input ports configured to receive a differential signal having a common mode voltage;
a polyphase filter having a pair of polyphase filter input ports and first, second, third and fourth output ports;
a first circuit configured to provide the differential signal with an adjusted common mode voltage to the pair of polyphase filter input ports;
wherein the first, second third and fourth output ports are each configured to output a square-wave signal, with 90° phase separation between consecutive output signals;
and a feedback circuit from the first, second, third and fourth outputs ports to the first circuit;
wherein the feedback circuit is configured to provide a feedback signal to the first circuit to set the adjusted common mode voltage from the common mode voltage.

2. The four-phase generation circuit of claim 1, wherein the differential signal is a pair of signals having 50% duty cycle and 180° phase separation therebetween.

3. The four-phase generation circuit of claim 1, wherein the feedback circuit is configured such that, in steady state, adjusted common mode has voltage is midway between a high voltage and a low voltage at a one of the first, second, third and fourth output ports.

4. The four-phase generation circuit of claim 1, wherein the feedback circuit comprises an exclusive NOR logic circuit having a respective input coupled to each of the first, second, third and fourth output ports, and an output providing an input to a low-pass filter.

5. The four-phase generation circuit of claim 4, wherein the low-pass filter has a cut-off frequency which is no more than one-fifth a frequency of the differential signal.

6. The four-phase generation circuit of claim 4, wherein the feedback circuit further comprises a operational amplifier, wherein the operational amplifier has an output configured to provide the feedback signal, a first input coupled to the output of the low-pass filter, and second input coupled to the voltage midway between a high voltage and a low voltage at a one of the first, second, third and fourth output ports.

7. The four-phase generation circuit of claim 1, wherein the first circuit is a differential amplifier circuit.

8. The four-phase generation circuit of claim 7, wherein the differential amplifier circuit comprises a leg for each of a first and second signal of the differential signal, each leg comprising a current source connected to a supply voltage and arranged in series with a switching transistor, the switching transistors having commonly connected sources, the commonly connected sources being coupled to ground through a current source, wherein the gate of each switching transistor is coupled to a respective one of the first and second signal.

9. The four-phase generation circuit of claim 8, wherein the gate of each switching transistor is coupled to the respective one of the first and second signal through a respective capacitor and coupled to a common bias voltage through a respective bias resistor.

10. The four-phase generation circuit of claim 8, wherein current source of each leg of the differential amplifier circuit is a voltage controlled current source, and the feedback signal is provided as a control signal to each of the voltage controlled current sources.

11. The four-phase generation circuit of claim 1, wherein, for each of the first and second signals of the differential signal, the polyphase filter comprises an in-phase branch and a quadrature branch, wherein each branch comprises a filter followed by at least one buffer.

12. The four-phase generation circuit of claim 11, wherein the respective at least one buffer comprises an even number of inverters.

13. The four-phase generation circuit of claim 11, wherein the filter of each in-phase branch of the polyphase filter comprises low pass filter having a cut-off frequency which is the same as that of the differential signal.

14. The four-phase generation circuit of claim 11, wherein the filter of each quadrature branch of the polyphase filter comprises high pass filter having a cut-off frequency which is the same as that of the differential signal and comprising a resistor coupled to a common quadrature bias voltage.

15. The four-phase generation circuit of claim 11 wherein the filter of each quadrature branch of the polyphase filter comprises high pass having a cut-off frequency which is the same as that of the differential signal, further comprising a resistor in parallel with a first buffer of the at least one buffers.

16. The four-phase generation circuit of claim 2, wherein the feedback circuit comprises an exclusive NOR logic circuit having a respective input coupled to each of the first, second, third and fourth output ports, and an output providing an input to a low-pass filter.

17. The four-phase generation circuit of claim 3, wherein the feedback circuit comprises an exclusive NOR logic circuit having a respective input coupled to each of the first, second, third and fourth output ports, and an output providing an input to a low-pass filter.

18. The four-phase generation circuit of claim 4, wherein the first circuit is a differential amplifier circuit.

19. The four-phase generation circuit of claim 4, wherein, for each of the first and second signals of the differential signal, the polyphase filter comprises an in-phase branch and a quadrature branch, wherein each branch comprises a filter followed by at least one buffer.

20. The four-phase generation circuit of claim 7, wherein, for each of the first and second signals of the differential signal, the polyphase filter comprises an in-phase branch and a quadrature branch, wherein each branch comprises a filter followed by at least one buffer.

\*   \*   \*   \*   \*